US009660600B2

(12) United States Patent
Whittaker

(10) Patent No.: US 9,660,600 B2
(45) Date of Patent: May 23, 2017

(54) DYNAMIC ERROR VECTOR MAGNITUDE COMPENSATION

(71) Applicant: SKYWORKS SOLUTIONS, INC., Woburn, MA (US)

(72) Inventor: Edward John Wemyss Whittaker, Bishop's Stortford (GB)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 14/574,936

(22) Filed: Dec. 18, 2014

(65) Prior Publication Data
US 2015/0180518 A1 Jun. 25, 2015

Related U.S. Application Data

(60) Provisional application No. 61/920,019, filed on Dec. 23, 2013.

(51) Int. Cl.
H01Q 11/12 (2006.01)
H03F 3/24 (2006.01)
H03F 1/02 (2006.01)
H03F 3/191 (2006.01)

(52) U.S. Cl.
CPC ............ H03F 3/245 (2013.01); H03F 1/0266 (2013.01); H03F 3/191 (2013.01); H03F 2200/18 (2013.01); H03F 2200/423 (2013.01); H03F 2200/451 (2013.01)

(58) Field of Classification Search
None
See application file for complete search history.

(56) References Cited

U.S. PATENT DOCUMENTS 4,245,336 A * 1/1981 Stietenroth ............ G04G 13/00 368/273
6,331,799 B1 12/2001 Miyazawa
6,873,211 B1 3/2005 Thompson et al.
(Continued)

FOREIGN PATENT DOCUMENTS

CN 101414805 4/2009
JP 2000-252766 9/2000
(Continued)

OTHER PUBLICATIONS

U.S. Appl. No. 14/448,793, filed Jul. 31, 2014.
U.S. Appl. No. 14/490,488, filed Sep. 18, 2014.

Primary Examiner — Hsin-Chun Liao
(74) Attorney, Agent, or Firm — Knobbe, Martens, Olson & Bear, LLP

(57) ABSTRACT

Aspects of this disclosure relate to compensating for dynamic error vector magnitude. A compensation circuit can generate a compensation signal based at least partly on an amount of time that an amplifier, such as a power amplifier, is turned off between successive transmission bursts of the amplifier. For example, the compensation circuit can charge a capacitor based at least partly on an amount of time that the amplifier is turned off between successive transmission bursts and generate the compensation signal based at least partly on an amount of charge stored on the capacitor. A bias circuit can receive the compensation signal, generate a bias signal based at least partly on the compensation signal, and provide the bias signal to the amplifier to bias the amplifier.

21 Claims, 12 Drawing Sheets

(56) References Cited

U.S. PATENT DOCUMENTS

| | | |
|---|---|---|
| 7,439,806 B2 | 10/2008 | Dow |
| 7,567,123 B2 | 7/2009 | Leung |
| 7,795,980 B2 | 9/2010 | Griffiths et al. |
| 7,821,335 B2 | 10/2010 | Shiramizu et al. |
| 7,869,775 B2 | 1/2011 | Alon et al. |
| 7,928,804 B2 | 4/2011 | Yamamoto et al. |
| 8,666,339 B2 | 3/2014 | Yu et al. |
| 8,717,101 B2 | 5/2014 | Li et al. |
| 9,136,803 B2 | 9/2015 | Li et al. |
| 2001/0041547 A1* | 11/2001 | Kazakevich .......... H03F 1/0205 455/127.1 |
| 2005/0032488 A1 | 2/2005 | Pehlke et al. |
| 2005/0134374 A1 | 6/2005 | Hench et al. |
| 2007/0024372 A1* | 2/2007 | Hagen .................. H03F 1/0227 330/297 |
| 2008/0180169 A1 | 7/2008 | Ripley et al. |
| 2009/0195318 A1 | 8/2009 | Kang et al. |
| 2010/0156539 A1 | 6/2010 | Ha et al. |
| 2011/0134664 A1* | 6/2011 | Berghegger ............ H02M 1/36 363/49 |
| 2012/0286873 A1* | 11/2012 | Li ......................... H03G 3/007 330/285 |
| 2013/0141167 A1 | 6/2013 | Kim et al. |
| 2013/0307625 A1 | 11/2013 | Hershberger et al. |
| 2013/0307627 A1 | 11/2013 | Hershberger |
| 2015/0035605 A1 | 2/2015 | Lam |
| 2015/0077187 A1 | 3/2015 | Lam et al. |
| 2015/0349730 A1 | 12/2015 | Li et al. |

FOREIGN PATENT DOCUMENTS

| | | |
|---|---|---|
| JP | 2007-019784 | 1/2007 |
| TW | 200746621 | 12/2007 |
| TW | 200810347 | 2/2008 |

* cited by examiner

DYNAMIC ERROR VECTOR MAGNITUDE COMPENSATION

RELATED APPLICATION

Any and all applications for which a foreign or domestic priority claim is identified in the Application Data Sheet as filed with the present application are hereby incorporated by reference under 37 CFR 1.57. This application is a non-provisional of U.S. Provisional Patent Application No. 61/920,019, filed on Dec. 23, 2013, the entire disclosure of which is hereby incorporated by reference herein.

TECHNICAL FIELD

This disclosure relates to electronic systems and, in particular, to amplifiers.

DESCRIPTION OF THE RELATED TECHNOLOGY

Radio frequency (RF) power amplifiers can be used to boost the power of a RF signal having a relatively low power. Thereafter, the boosted RF signal can be used for a variety of purposes, included driving the antenna of a transmitter.

Power amplifiers can be included in mobile phones to amplify an RF signal for transmission. For example, in mobile phones that communicate using a wireless local area network (WLAN) protocol and/or any other suitable communication standard, a power amplifier can be used to amplify the RF signal. Amplifying the RF signal to an incorrect power level or introducing significant distortion of the original RF signal can cause a wireless device to transmit out of band or violate compliance with accepted standards. Biasing a power amplifier device can determine the voltage and/or current operating point of the amplifying devices within the power amplifier.

There is a need for improved power amplifier systems. Furthermore, there is a need for improving power amplifier biasing.

SUMMARY OF CERTAIN INVENTIVE ASPECTS

Figure 1:
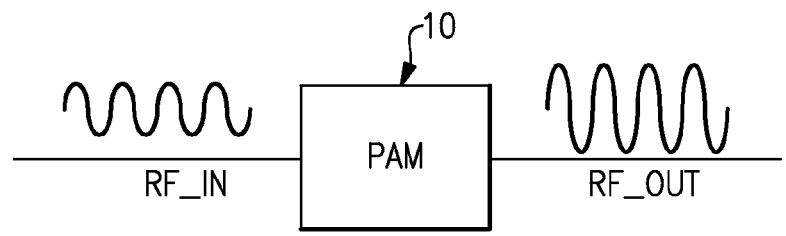
FIG. 1 is a schematic diagram of a power amplifier module for amplifying a radio frequency (RF) signal.

The innovations described in the claims each have several aspects, no single one of which is solely responsible for its desirable attributes. Without limiting the scope of the claims, some prominent features will now be briefly described.

One aspect of this disclosure is a method that includes selectively charging a capacitor based at least partly on an amount of time that a power amplifier is disabled between successive transmission bursts; generating a bias signal based at least partly on an amount of charge stored on the capacitor; and biasing the power amplifier with the bias signal such that the power amplifier has a substantially constant gain.

The method can further include, prior to selectively charging, fully charging the capacitor to a full amount of charge prior to the power amplifier being turned on after a cold start. Selectively charging can include charging the capacitor to less than a full amount of charge. Selectively charging can be based at least partly on a voltage level of the power supply voltage. The method can further include scaling a reference signal generated from the capacitor, and generating the bias signal can be based at least partly on the scaled reference signal. Such scaling can be performed by a digital-to-analog converter performs said scaling.

Another aspect of this disclosure is a power amplifier system that includes a power amplifier, a compensation circuit, and a bias circuit. The power amplifier is configured to receive a bias signal, receive a radio frequency (RF) signal, and generate an amplified RF signal. The compensation circuit includes a capacitor configured to charge and discharge. The compensation circuit is configured to charge the capacitor based at least partly on an amount of time that the power amplifier is turned off between successive transmission bursts of the power amplifier. The compensation circuit is configured to generate a compensation signal based at least partly on an amount of charge stored on the capacitor. The bias circuit is configured to generate the bias signal based at least partly on the compensation signal.

The compensation circuit can charge the capacitor based at least partly on an enable signal of the power amplifier. In some of these embodiments, the bias circuit can receive the enable signal and to selectively pulse an output of the power amplifier based at least partly on the enable signal. The compensation circuit can include a scaling circuit to generate the compensation signal based at least partly on scaling a signal from the capacitor, and the bias circuit can generate the bias signal based at least partly on a combination of the compensation signal and a reference signal. The compensation circuit can include a power supply boost circuit to adjust current to charge the capacitor based at least partly on a voltage level of a power supply voltage.

The bias circuit can control the bias signal such that a gain of the power amplifier is substantially constant as the amount of time between successive transmission bursts of the power amplifier changes. The bias signal can be a bias current.

The power amplifier can include a bipolar power amplifier transistor having a base and a collector, in which the base can receive the bias signal and the collector can provide the amplified RF signal. The power amplifier, the compensation circuit, and the bias circuit can be included within a single package, such as a plastic package.

Another aspect of this disclosure is an apparatus that includes an amplifier, a compensation circuit, and a bias circuit. The amplifier is configured to amplify an input signal. The compensation circuit is configured to generate a compensation signal based at least partly on an amount of time that the amplifier is turned off between successive transmission bursts of the amplifier. The bias circuit is configured to receive the compensation signal, generate a bias signal based at least partly on the compensation signal, and provide the bias signal to the amplifier to bias the amplifier.

The compensation circuit can include a digital-to-analog converter configured to receive a reference voltage from the capacitor and generate the compensation signal based at least partly on the reference voltage and a digital-to-analog converter control word.

The compensation circuit can include a capacitor configured to charge and discharge, and the compensation circuit can charge the capacitor based at least partly on the amount of time that the amplifier is turned off between successive transmission bursts of the amplifier. The compensation circuit can charge the capacitor to a full amount of charge responsive to the amplifier being turned on after a cold start.

The amplifier can be a power amplifier. The apparatus can be a mobile device that includes the power amplifier, the compensation circuit, the bias circuit, and an antenna configured to transmit an RF signal from the power amplifier.

Yet another aspect of this disclosure is a circuit for biasing an amplifier. The circuit includes a compensation circuit including an integration circuit configured to adjust an output based on an amount of time that the amplifier is turned off between successive transmission bursts. The circuit also includes a bias circuit configured to generate a bias signal based at least partly on the output signal from the integration circuit, and to bias the amplifier with the bias signal.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale.

Apparatus and methods for biasing amplifiers, such as power amplifiers, are disclosed herein. In certain implementations, a power amplifier system includes a power amplifier and a bias circuit. The power amplifier can be used to amplify a radio frequency (RF) signal for transmission, and the bias circuit can be used to generate a bias voltage and/or bias current for biasing the power amplifier. The power amplifier bias circuit can receive an enable signal that can be used to enable or disable the power amplifier so as to pulse an output of the power amplifier.

Self-heating of an amplifier, such as a power amplifier, can affect the settling time for the amplifier. Relatively long settling times can affect dynamic error vector magnitude (DEVM). Previous DEVM compensation has encountered problems with maintaining substantially constant power amplifier gain when there is a relatively short period of time between bursts when the power amplifier is enabled.

Aspects of this disclosure relate to charging a capacitor based on an amount of time between successive transmission bursts of an RF power amplifier. The amount of charge on the capacitor can be used to generate a boost on a bias signal, such as a bias current, for the RF power amplifier. The charging and discharging of the capacitor can be controlled to create a compensation signal. The compensation signal can be a current signal or a voltage signal. A biasing circuit can bias the RF power amplifier using the compensation signal to compensate for DEVM. Accordingly, the compensation signal can be used to maintain a substantially constant gain of the power amplifier. For example, the bias circuit can keep the collector current of a bipolar power amplifier transistor at a substantially constant current based on the compensation signal. Accordingly, the bias of the RF power amplifier can be generated such that DEVM can be compensated for to account for an amount of time that the RF power amplifier is turned off between successive transmission bursts.

While this disclosure may describe examples in connection power amplifiers for illustrative purposes, the principles and advantages described herein may be applied to other suitable amplifiers. For example, the principles and advantages described herein can be applied to biasing low-noise amplifiers (LNAs) and/or other amplifiers.

FIG. 1 is a schematic diagram of a power amplifier module 10 for amplifying a radio frequency (RF) signal. The illustrated power amplifier module (PAM) 10 is configured to amplify an RF signal RF_IN to generate an amplified RF signal RF_OUT. As described herein, the power amplifier module 10 can include one or more power amplifiers, including, for example, multi-stage power amplifiers.

Figure 2:
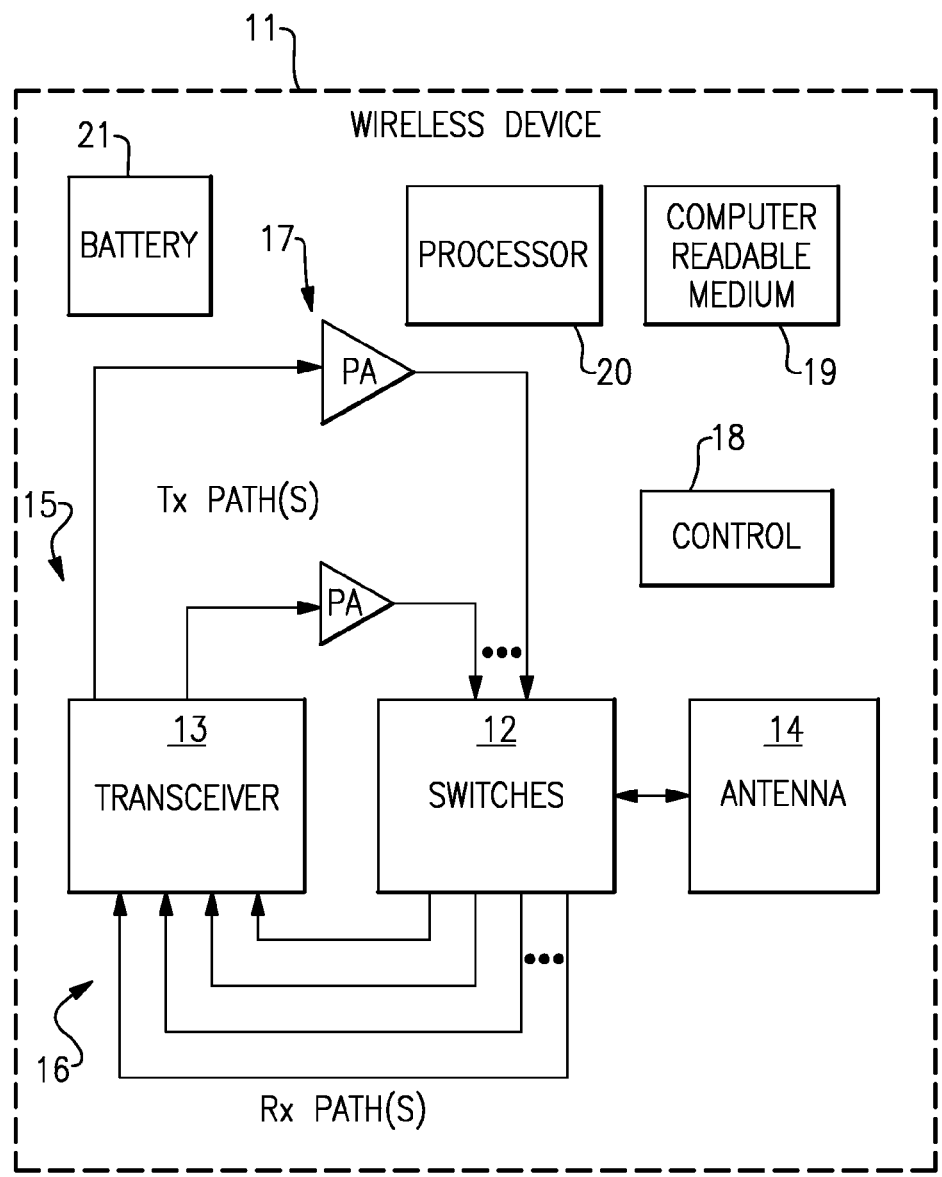
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include a power amplifier bias circuit implementing one or more features of the present disclosure in a control component 18. The power amplifier bias circuit can include a DEVM compensation circuit and a primary biasing circuit. More details regarding embodiments of these circuits will be provided later, for example, with reference to FIGS. 6 to 8E.

The example wireless device 11 depicted in FIG. 2 can represent a multi-band and/or multi-mode device such as a multi-band/multi-mode mobile phone. In certain embodiments, the wireless device 11 can include a switch module 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal, such as a WLAN 802.11g signal, or any other suitable pulsed signal. In certain embodiments, one or more of the power amplifiers 17 are configured to amplify a Wi-Fi signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example communication standards, modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switch module 12 can be configured to electrically connect the antenna 14 to a selected transmit or receive path. Thus, the switch module 12 can provide a number of switching functionalities associated with an operation of the wireless device 11. In certain embodiments, the switch module 12 can include a number of switches configured to provide functionalities associated with, for example, switching between different bands, switching between different power modes, switching between transmission and receiving modes, or some combination thereof. The switch module 12 can also be configured to provide additional functionality, including filtering and/or duplexing of signals.

FIG. 2 shows that in certain embodiments, a control component 18 can be provided for controlling various control functionalities associated with operations of the switch module 12, the power amplifiers 17, and/or other operating component(s). The control component 18 can be implemented on the same die as the power amplifier 17 in certain implementations. The control component 18 can be implemented on a different die than the power amplifier in some implementations. Non-limiting examples of the control component 18 that include a compensation circuit and a bias circuit to compensate for dynamic error vector magnitude are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide instructions for implementing the acts specified in the flowchart and/or block diagram block or blocks.

The battery 21 can be any suitable battery for use in the wireless device 11, including, for example, a lithium-ion battery.

Figure 3:
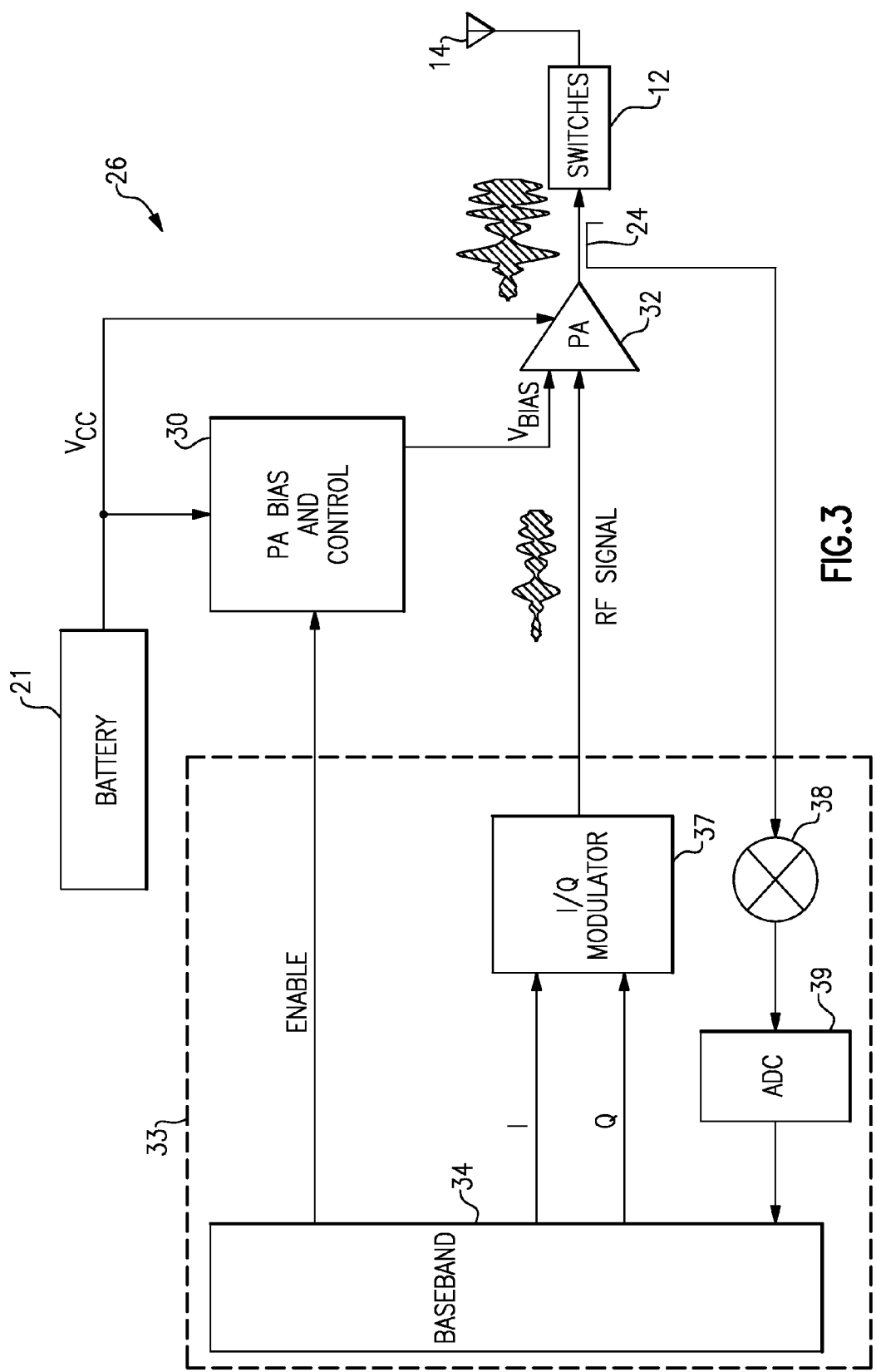
FIG. 3 is a schematic block diagram of one example of a power amplifier system.

FIG. 3 is a schematic block diagram of an illustrative power amplifier system 26. The illustrated power amplifier system 26 includes the switch module 12, the antenna 14, the battery 21, a directional coupler 24, a power amplifier bias and control circuit 30, a power amplifier 32, and a transceiver 33. The illustrated transceiver 33 includes a baseband processor 34, an I/Q modulator 37, a mixer 38, and an analog-to-digital converter (ADC) 39.

The baseband signal processor 34 can generate an I signal and a Q signal, which can be used to represent a sinusoidal wave or signal of a desired amplitude, frequency, and phase. For example, the I signal can represent an in-phase component of the sinusoidal wave and the Q signal can represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate a RF signal. For example, the I/Q modulator 37 can include digital-to-analog converters (DACs) configured to convert the I and Q signals into an analog format, mixers for upconverting the I and Q signals to radio frequency, and a signal combiner for combining the upconverted I and Q signals into a RF signal suitable for amplification by the power amplifier 32. In certain implementations, the I/Q modulator 37 can include one or more filters configured to filter frequency content of signals processed therein.

The power amplifier bias and control circuit 30 can receive an enable signal ENABLE from the baseband processor 34 and a battery or power high voltage $V_{CC}$ from the battery 21, and can generate a bias voltage $V_{BIAS}$ for the power amplifier 32 based on the enable signal ENABLE. The power amplifier bias and control circuit 30 can also include circuitry configured to perform dynamic error vector magnitude compensation as will be discussed in more detail later. Although FIG. 3 illustrates the battery 21 directly generating the power high voltage $V_{CC}$, in certain implementations the power high voltage $V_{CC}$ can be a regulated voltage generated by a regulator that is electrically powered using the battery 21. The power amplifier 32 can receive the RF signal from the I/Q modulator 37 of the transceiver 33, and can provide an amplified RF signal to the antenna 14 through the switch module 12.

The directional coupler 24 can be positioned between the output of the power amplifier 32 and the input of the switch module 12, thereby allowing an output power measurement of the power amplifier 32 that does not include insertion loss of the switch module 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32.

Figure 4:
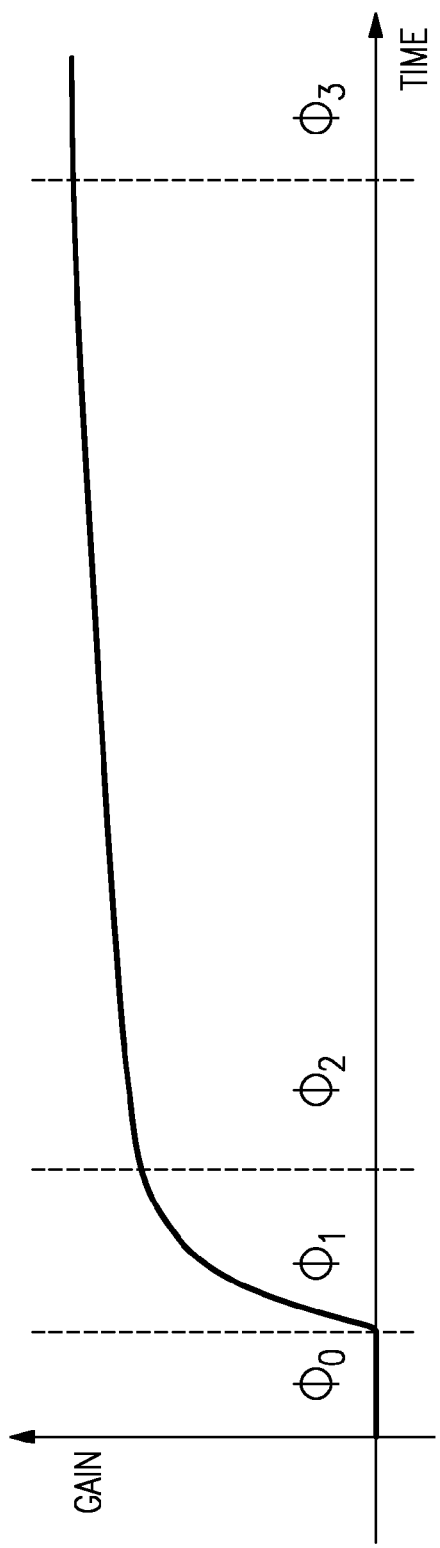
FIG. 4 is a graph of one example of power amplifier gain versus time.

FIG. 4 is a graph of power amplifier gain versus time for an example power amplifier. The graph includes an initial phase $\Phi_0$, in which the power amplifier is disabled and has a low gain, such as a gain of about 0. After the initial phase $\Phi_0$, the power amplifier is enabled. For example, the end of the initial phase $\Phi_0$ can correspond to a time instance when the enable signal ENABLE of FIG. 3 transitions from a deactivated state to an activated state.

As shown in FIG. 4, after being enabled, the power amplifier can operate in multiple phases associated with different gains. For example, the power amplifier can include a first phase $\Phi_1$, in which the power amplifier's gain can begin to settle based on a dominant influencing factor. Additionally, the power amplifier can include a second phase $\Phi_2$ in which gain can further settle based on one or more non-dominant influencing factors. Furthermore, in a third phase $\Phi_3$, the power amplifier's gain can be settled and substantially constant. In this third phase $\Phi_3$, the power amplifier amplifier's error vector magnitude (EVM) can correspond to the power amplifier's static error vector magnitude (SEVM). EVM of an unpulsed amplifier can be referred to as SEVM. EVM of a pulsed amplifier can be referred to as dynamic EVM (DEVM). Transient effects can cause additional error compared to an unpulsed condition. Accordingly, DEVM is typically worse than SEVM.

A power amplifier's gain can settle over time for a variety of reasons. For example, physical circuit limitations may prevent a power amplifier from turning on instantly. Additionally, when the power amplifier is activated, the power amplifier may begin to heat, which can lead to a thermal transient that changes the performance characteristics of the power amplifier's circuitry. The thermal transient can be affected by a variety of factors, such as self-heating of devices, mutual heating of devices, thermal mismatch between devices, cross die heat transfer, the like, or any combination thereof.

In certain applications, a power amplifier can provide amplification before the gain of the power amplifier system is fully settled. For example, the power amplifier may provide amplification during the second phase $\Phi_2$, since the power amplifier's thermal time constant may be longer, and in some instances significantly longer, than the power amplifier's rated or specified turn-on time. Before the power amplifier's gain is fully settled, the power amplifier can have a dynamic error vector magnitude (DEVM) that can be worse that the power amplifier's SEVM.

From a system perspective, the distortion of the RF input signal provided to the amplifier for amplification can be represented by either the DEVM or SEVM figure of merit. The distortion that the RF input signal experiences is typically dependent upon time after the amplifier is activated and before the amplifier has achieved a steady-state condition. Moreover, the receiver demodulation level can be set during the preamble, so any change in gain after that can cause error and poor EVM.

Although FIG. 4 illustrates the power amplifier's gain changing over time due to thermal effects, it will be understood that other parameters of the power amplifier can change with time, including, for example, the amplifier's phase. The principles and advantages described herein are applicable to gain correction and/or to other types of correction, such as phase correction.

Figure 5A:
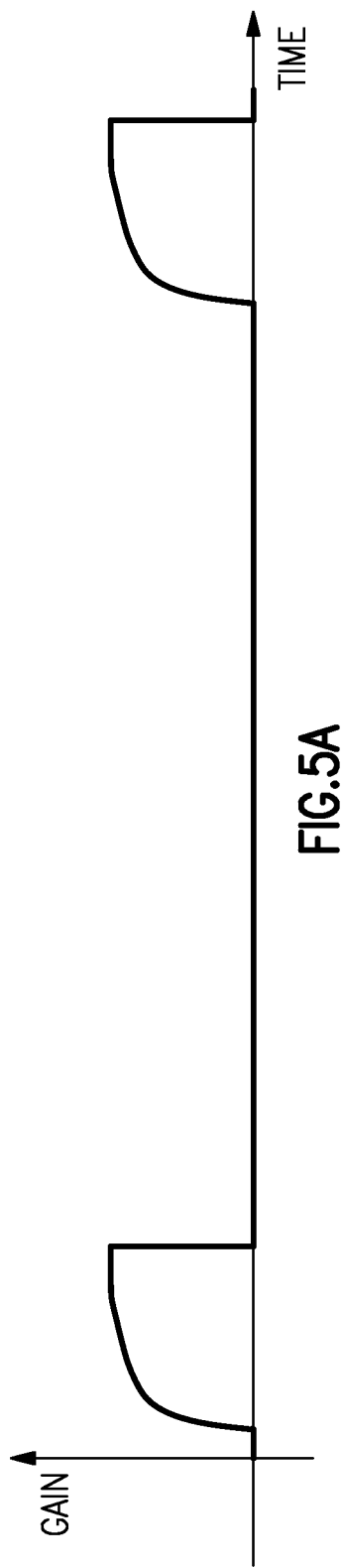
FIGS. 5A-5B are graphs of two examples of power amplifier gain versus time.
Figure 5B:
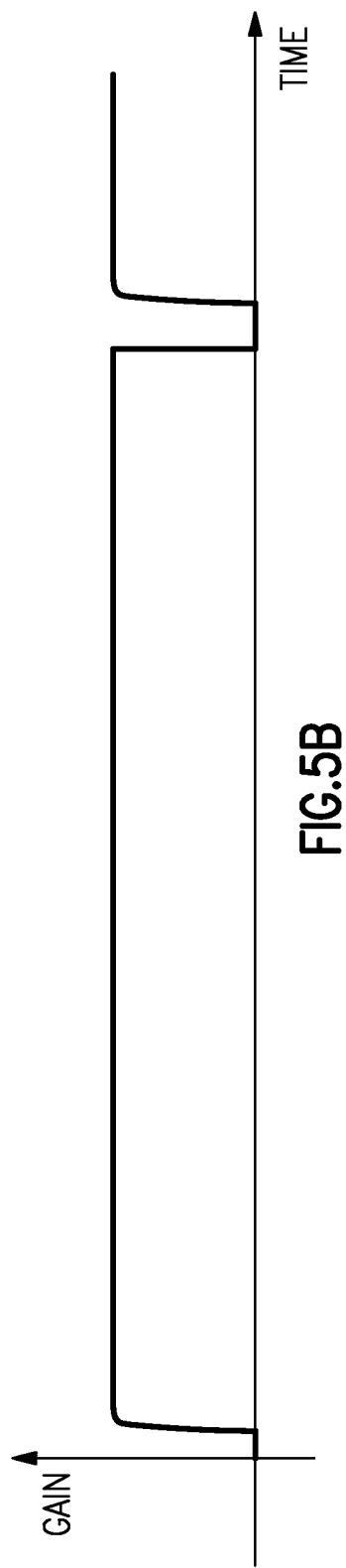

FIGS. 5A and 5B are graphs of two examples of power amplifier gain versus time curves. In FIG. 5A, a power amplifier is turned off for a relatively long duration between activation cycles. In contrast, in FIG. 5B, a power amplifier is turned off for a relatively brief duration between activation cycles. In the curve shown in FIG. 5A, the temperature of the power amplifier can be relatively cold at the start of the second pulse. The relatively cold temperature of the power amplifier can result increase the impacts of transient gain effects associated with pulsing the power amplifier. In contrast, in the configuration shown in FIG. 5B, the temperature of the power amplifier can be relatively hot at the start of the second pulse, which can result in the power amplifier having a relatively small amount of transient gain effects.

Absent compensation, the DEVM of the power amplifier can vary based on the pulsing operations of the power amplifier, including, for example, an off-time between pulses and/or a duty cycle of the pulses. The dependence of the power amplifier's gain and/or phase on pulsing operations can make it difficult to compensate for the power amplifier's DEVM using static techniques, such as resistor-capacitor (RC) compensation. Moreover, DEVM has been problematic in applications in which the power amplifier is encapsulated in a plastic package. The thermal profile of the power amplifier in the plastic package can contribute to DEVM.

Aspects of this disclosure relate to keeping a gain of power amplifier on an integrated circuit stable during a transmission burst regardless of an amount of time between successive bursts. For instance, the DEVM compensation described herein can provide substantially the same gain for when a power amplifier has a relatively long amount of time between transmission bursts, for example as shown in FIG. 5A, and when the same power amplifier has a relatively short amount of time between transmission bursts, for example as shown in FIG. 5B.

It was observed that the gain of a low distortion integrated circuit RF power amplifier varied as the power amplifier warms up during use. This was noticeable when the power amplifier was first enabled. The observed gain characteristic of an uncorrected power amplifier, when it is enabled from cold, is a gain which initially starts too low then has an asymptote to a stable gain with a time constant on the order of, for example, 100 us to 250 us, such as about 180 us for some SiGe power amplifiers.

However, some wireless transmission systems which involve quadrature amplitude modulation (QAM) and do not employ amplitude tracking during a transmission burst (for example, a WLAN 802.11g transmission burst). Such systems may suffer a degradation of transmission if the received signal were to drift in amplitude. As one way to avoid this, the gain of the power amplifier can be made substantially stable during the transmission burst. In a relatively short amount of time, such as first few microseconds or tens of microseconds (depending on an applicable standard), the receiver can capture the amplitude calibration of the transmitted burst but the calibration can degrade as the amplitude of the receive signal drifts due to gain variations in the power amplifier during the burst.

The mechanism for gain shortfall at the start of the burst may be due to the time taken to stabilize the operating point of each of the stages of the power amplifier. The effect can be predominately thermal. NPN transistor amplifying stages might be expected to lose gain as the power amplifier warms up, since the NPN device can follow a basic diode temperature law. This may be observed after an extended period of operation and does not pose a problem for in certain applications, such as WLAN transmissions.

The phenomenon of increasing gain at the initial enablement of the power amplifier can be mirrored by a similar profile in the operating current of the power amplifier. The effective ratio between the reference NPN device and the amplifying stage can change. This can be caused by a changing temperature difference between the amplifying NPN stage and one or more corresponding bias reference transistors. If the reference transistor(s) were to track the temperature of the amplifying stage, this effect may be less pronounced or may not even be present.

After an extended period when the power amplifier has been off, both devices should be at approximately the same temperature. When the power amplifier is turned on, then heat is generated in both the amplifying stage and the reference device due to the current flow through them. However, their respective rates of heating and respective settling temperatures may not be match for one or more of the following reasons:

1. A direct current (DC) voltage across the reference device is invariably less than across the amplifying device;

2. The amplifying device includes a number of parallel NPN devices, which although individually well matched to the reference device, these parallel NPN devices are usually closely spaced and warm up relatively quickly; and/or 3. The superposition of RF signal through the amplifying device and its re-biasing can cause further heating of the amplifying stage as it moves away from certain types of operation, such as class A operation.

The gain drift can be multiplied by the number of amplifying stages since each stage can suffer from the same and/or similar problems. As such, DEVM compensation can be easier to compensate for in two stage power amplifiers than in three stage power amplifiers.

Previous DEVM correction schemes have encountered issues with compensating for a decrease in gain, which can be referred to as gain droop, at and/or near the beginning of a transmission burst. Such issues have been problematic, for example, in applications with a relatively short time between transmission bursts, for example as shown in FIG. 5B.

Aspects of this disclosure relate to creating a boost in a power amplifier bias signal to correct the gain droop at the beginning of the burst that depends on an interval for which the power amplifier is turned off between bursts. When the length of time for which the power amplifier is turned off between bursts is at least several times the boost time constant, then the boost to maintain a substantially constant gain can be substantially independent of the time that off time that the power amplifier is turned off. As the time the power amplifier is turned off begins to approach the boost time constant, then the amount of boost can be reduced while still maintaining a substantially constant power amplifier gain. As the time that the power amplifier is turned off is reduced to a small fraction of the boost time constant, the amount of boost to maintain a power amplifier gain can be reduced to a relatively small amount. The amount of boost to maintain a power amplifier gain can be dependent on a temperature difference between a reference transistor and an amplifying transistor returning. In effect, as the time that the power amplifier is turned off is reduced, the transistors in the reference and amplifier sections will cool down less. Moreover, the time constant of the temperature difference may be similar to a boost time constant applied to correct an isolated transmit burst.

In certain applications, the time constant of the gain correction can be around 180 us. Typical data bursts used for WLAN data transmission last around 180 us. Thus, an amount of boost correction desired for a 10% transmit duty cycle (for example, with 1620 us between data bursts) is likely to be more than the boost needed for a 50% duty cycle (for example, with 180 us between bursts). Measurements on power amplifiers support this observation. The amount of boost correction desired can be dependent upon the duty cycle that the WLAN power amplifier experiences.

Figure 6:
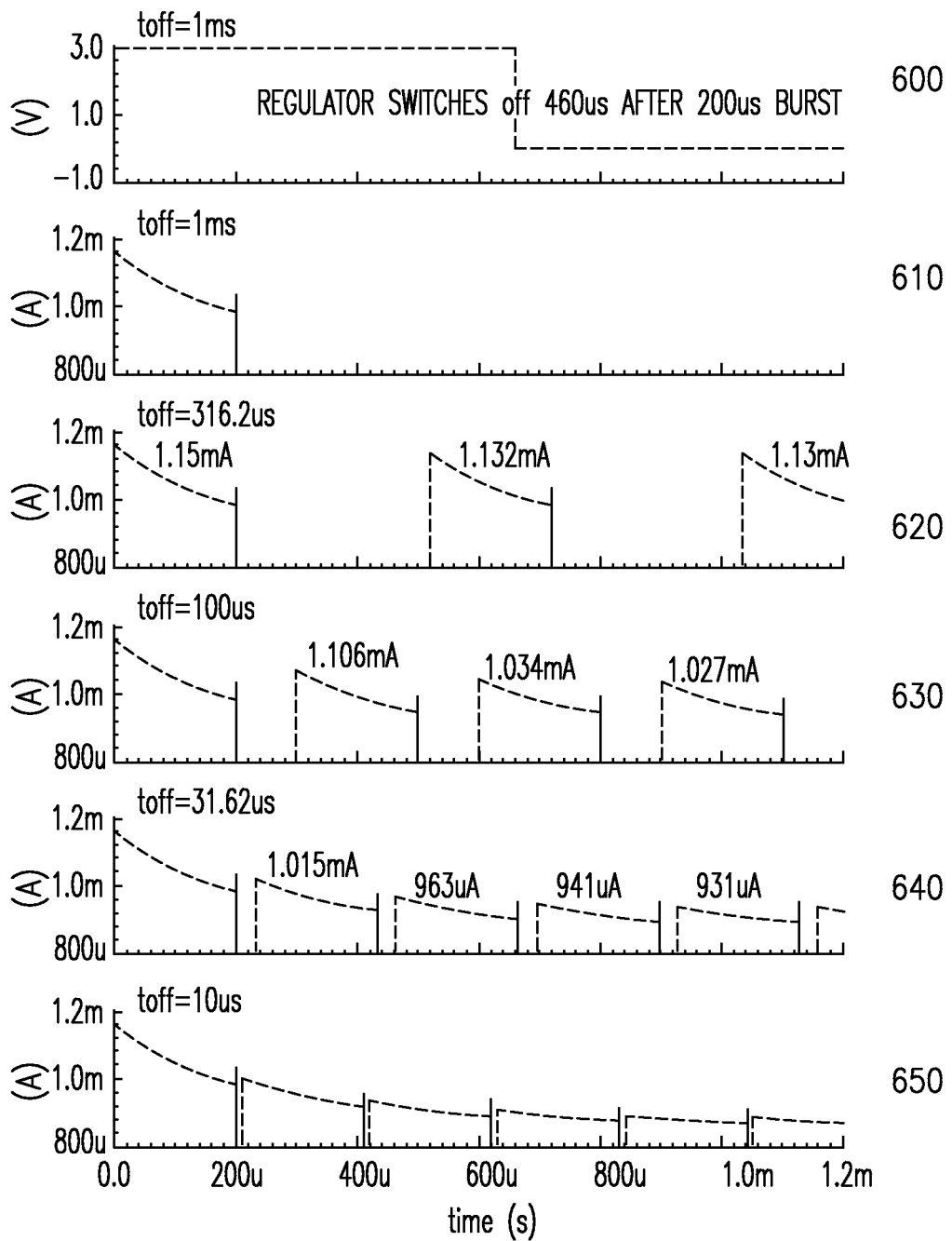
FIG. 6 includes graphs that illustrate bias current versus time for various transmissions bursts with different amounts of time between bursts and a graph of a bias network supply voltage versus time.

Referring to FIG. 6, graphs of bias current with DEVM compensation versus time for various transmissions bursts with different amounts of time between bursts will be described. The bias currents illustrated in these graphs can be implemented by one or more features described herein. With reference to FIG. 6, a graph of a bias network supply voltage versus time will be also described. The DEVM compensation described herein can control recharging of an RC circuit to compensate for DEVM based on a length of time that a power amplifier is turned off between successive transmission bursts.

Graphs 610 to 650 illustrate a DEVM compensation current for biasing a power amplifier associated with the power amplifier transmitting 200 us data bursts with the power amplifier being turned off different amounts of time between successive data bursts. The currents corresponding to the graphs 610 to 650 can maintain a substantially constant gain of a power amplifier independent of the time between successive transmission bursts. The times and currents shown in these graphs are provided for illustrative purposes. Accordingly, the principles and advantages discussed herein can be applied to other amounts of current and/or time periods.

At time t=0, a power amplifier can be completely in the 'off' state and cooled down. Then the power amplifier can be enabled. This can be referred to a cold start. The first data burst after a cold start can receive a full current boost such that the bias current is, for example, about 1.15 mA as shown in FIG. 6. Depending on a duration of an off period between successive transmission bursts, subsequent current boost levels can be adjusted. The graphs 610 to 650 represent currents that can be supplied to a second stage of a power amplifier. Graph 610 illustrates current boost over time for an off period of 1 ms between transmission bursts of 200 us, graph 620 illustrates current boost over time for an off period of 316 us between transmission bursts of 200 us, graph 630 illustrates current boost over time for an off period of 100 us between transmission bursts of 200 us, graph 640 illustrates current boost over time for an off period of 31 us between transmission bursts of 200 us, and graph 650 illustrates current boost over time for an off period of 10 us between transmission bursts of 200 us. These graphs show that DEVM compensation current can be adjusted based on an amount of time that a power amplifier is turned off between successive transmission bursts. As shown in FIG. 6, with a relatively short off period between successive transmission bursts, DEVM compensation can be relatively small. In some implementations, a relatively short off period between successive transmission bursts can be about 1 ms or less.

A power amplifier can cool off relatively more as the time between successive transmission bursts increases. For instance, the power amplifier can cool off more between the transmission bursts corresponding to graph 620 than between the transmission bursts corresponding to graph 650. When the power amplifier cools off less from being turned off for a shorter period of time, the boost current for the next transmission burst can be provided at a lower starting current compared to when the power amplifier cools off more.

Graph 600 illustrates that for a 1 ms 'off' period corresponding to the graph 610, a power amplifier bias network can be deactivated about 460 us after the end of a data burst. At that point, the power amplifier can be entirely turned off and any subsequent data burst could be treated as being a first transmission burst after a cold start.

In graphs 610 to 650, a boost current can begin at about 1.15 mA in the first transmission burst after a cold start. The boost current can be decreased as the power amplifier warms up while transmitting to maintain a gain of the power amplifier. When the power amplifier is turned off, the boost current can be approximately zero. As shown in graph 630, when there is 100 us between successive transmission bursts, the next transmission burst can begin at a current of about 1.106 mA and boost currents corresponding to subsequent transmission bursts can start at about 1.034 mA and then 1.027 mA in an example implementation. When the amount of time between transmission bursts is relatively less, then the beginning boost current for each successive transmission burst can keep decreasing. The relatively short time of about 10 us between successive transmission bursts in the graph 650 shows that the boost current can approach an exponential decay function. The bias current can approach a steady state current, for example, at about 900 uA in the graph 650.

The DEVM compensation described herein can reduce and/or minimize an effect of the difference in temperature between a reference transistor and an RF amplifying transistor in a manner independent of the period of time that the power amplifier is turned off between successive transmission bursts. Accordingly, the power amplifier can provide a desired gain throughout a cycle of signal transmission, which may include periods of relatively high duty cycle and/or relatively low duty cycle that can be controlled by an enable signal. Such DEVM compensation can be transparent to an RF transmission system, which can include baseband components, RF components, and front-end components. This can provide DEVM compensation without placing a control burden on the system outside the power amplifier system.

Amplifier performance can be adjusted as operating conditions change in accordance with the DEVM correction described herein. An electrical circuit can generate a correction signal to approximate thermal characteristics of the power amplifier. The power amplifier bias can be adjusted based on the correction signal to maintain a substantially constant gain. An integration circuit can increase and/or decrease the correction signal based whether the power amplifier is turned on or turned off. For example, a capacitor can be charged when the power amplifier is turned off and subsequent charging of the capacitor can be controlled based on an amount of time the amplifier is turned off between successive transmission bursts. Such a capacitor can be used in generating the currents shown in graphs 610 to 650 of FIG. 6. As such, the power amplifier can be biased to mitigate the thermal factors affecting DEVM, such the thermal affects associated with the curves shown in FIGS. 5A and 5B. Moreover, DEVM correction can be adjusted over time to adjust for changes in the amount time between successive transmission bursts over time.

Figure 7:
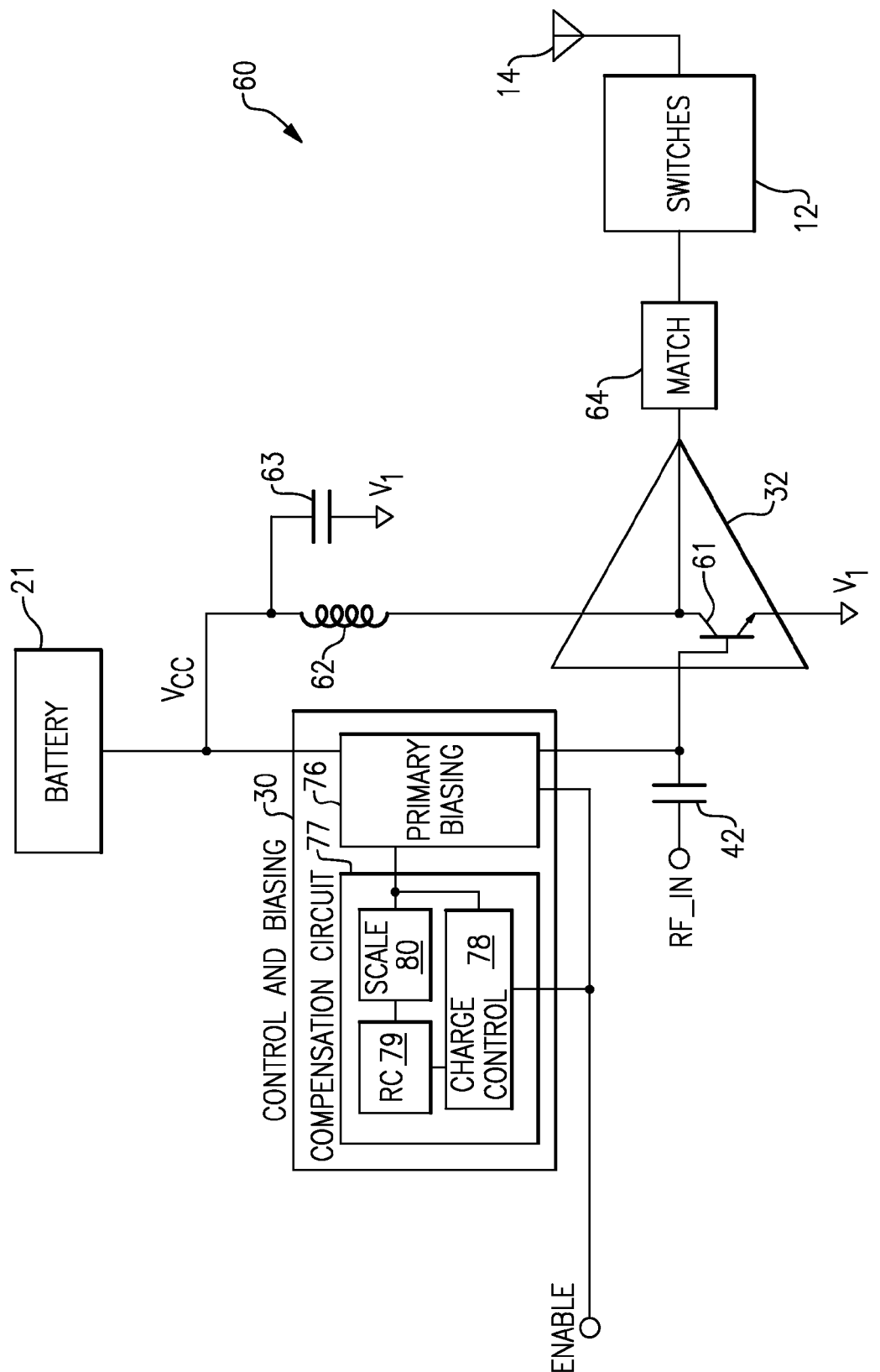
FIG. 7 is schematic block diagrams of illustrative power amplifier systems with dynamic error vector magnitude compensation according to certain embodiments.

FIG. 7 is schematic block diagram of an illustrative power amplifier system 60 with dynamic error vector magnitude compensation according to an embodiment. The illustrated power amplifier system 60 includes a control and biasing circuit 30, a battery 21, a power amplifier 32, an inductor 62, a decoupling capacitor 63, an input capacitor 42, an impedance matching block 64, a switch module 12, and an antenna 14. As illustrated, the control and biasing circuit 30 includes a primary biasing circuit 76 and a compensation circuit 77. The illustrated compensation circuit 77 includes a charge control circuit 78, an RC circuit 79, and a scaling circuit 80. Although FIG. 7 illustrates one implementation of the power amplifier 32, it will be understood that the principles and advantages described herein can be implemented in connection with a variety of other power amplifier structures, including, for example, multi-stage power amplifier structures and/or power amplifiers employing other transistor structures. Furthermore, the principles and advantages discussed herein can be implemented in connection with any amplifier that can benefit from DEVM compensation.

The control and biasing circuit 30 can receive an enable signal for the power amplifier 32. The enable circuit can cause the control and biasing circuit 30 to turn the power amplifier 32 on and to turn the power amplifier 32 off depending on the state of the enable signal. For example, the enable signal can activate or deactivate the primary biasing circuit 76 responsive to a transition in the state of the enable signal. The enable signal can be provided to the charge control circuit 78. The charge control circuit 78 can control charging of a capacitor in the RC circuit 79 based on the amount of time that the power amplifier 32 is turned off. The charge control circuit 78 can also control discharging of the capacitor of the RC circuit 78 when the power amplifier 32 is turned off. Additionally, the charge control circuit 78 can control charging and/or discharging of the capacitor in the RC circuit 79 based on a signal provided by the scaling circuit 80. An output of the RC circuit 79 can be scaled by the scaling circuit 80. The scaling circuit 80 can include, for example, a digital-to-analog converter (DAC). The DAC can receive an indication of charge stored on the capacitor of the RC circuit 79 as a reference signal, such as a reference voltage. The DAC can be programmed with a DAC control word that sets the scaling of the reference signal.

The primary biasing circuit 76 is configured to receive the enable signal, a compensation signal from the compensation circuit 77, and the battery or power high voltage $V_{CC}$. The primary biasing circuit 76 can use the compensation signal and the enable signal to generate a bias signal for biasing the power amplifier 32. For example, the primary biasing circuit 76 can be used to generate a bias signal, such as a bias current or a bias voltage, that can be used to bias the base of the bipolar power amplifier transistor 61 of the power amplifier 32. The primary biasing circuit 76 can use the enable signal to control or vary a magnitude of the bias signal over time so as to enable or disable the power amplifier and thereby pulse the power amplifier's output. For example, when the enable signal indicates the power amplifier 32 should be activated, the primary biasing circuit 76 can change the amplitude of the bias signal so as to achieve a desired gain of the power amplifier 32. When the power amplifier 32 is configured to transmit a WLAN signal, such as a Wi-Fi signal, the enable signal ENABLE can be selectively controlled so as to pulse the output of the power amplifier 32. Similarly, when the enable signal indicates that the power amplifier 32 should be deactivated, the primary biasing circuit 76 can decrease the bias signal such that the gain of the power amplifier 32 is relatively low, for example, about 0.

The primary biasing circuit 76 can also use the compensation signal to adjust, for example, boost, a magnitude of the bias signal over time to compensate for DEVM. For example, when the compensation signal indicates the power amplifier 32 is operating under relatively hot conditions, such as conditions associated with the curve of FIG. 5B, the primary biasing circuit 76 can apply a relatively small increase to the bias signal. As another example, when the correction signal indicates the power amplifier 32 is operating under relatively cold conditions, such as conditions associated with the curve of FIG. 5A, the primary biasing circuit 76 can apply a relatively large increase to the bias signal. Accordingly, the primary biasing circuit 76 can adjust the bias signal to compensate for DEVM based on operating conditions as the operating conditions change.

For instance, as illustrated, the output of the compensation circuit 77 can be provided to the primary biasing circuit 76. This output can be referred to as a compensation signal. As illustrated in FIG. 7, the output of the compensation circuit 77 can be generated by the scaling circuit 80. The primary biasing circuit 76 can combine the output of compensation circuit 77 with a reference bias signal for the power amplifier 32. For instance, the primary biasing circuit 76 can combine a reference bias signal from a bandgap reference circuit with the output of the compensation circuit 77 to bias the power amplifier 32.

With continued reference to FIG. 7, the illustrated power amplifier 32 includes a bipolar power amplifier transistor 61 having an emitter, a base, and a collector. The emitter of the bipolar power amplifier transistor 61 can be electrically connected to a first or power low voltage $V_1$, which can be, for example, a ground supply, and a radio frequency input signal RF_IN can be provided to the base of the bipolar power amplifier transistor 61 through the input capacitor 42. The bipolar power amplifier transistor 61 can amplify the RF input signal RF_IN and provide the amplified RF signal at the collector. The bipolar power amplifier transistor 61 can be any suitable device. In one implementation, the bipolar power amplifier transistor 61 is a heterojunction bipolar transistor (HBT).

The power amplifier 32 can be configured to provide the amplified RF signal to the switch module 12. The impedance matching block 64 can aid in terminating the electrical connection between the power amplifier 32 and the switch module 12. For example, the impedance matching block 64 can increase power transfer and/or reduce reflections of the amplified RF signal.

The inductor 62 can be included to aid in electrically powering the power amplifier 32 with the power high voltage $V_{CC}$ from the battery 21 while choking or blocking high frequency RF signal components. The inductor 62 can include a first end electrically connected to the power high voltage $V_{CC}$ and a second end electrically connected to the collector of the bipolar power amplifier transistor 61. As illustrated, the decoupling capacitor 63 is electrically connected between the power high voltage $V_{CC}$ and the power low voltage $V_1$ and can provide a low impedance path to high frequency signals, thereby reducing the noise of the power high voltage $V_{CC}$, improving power amplifier stability, and/or improving the performance of the inductor 62 as a RF choke.

Figure 8A:
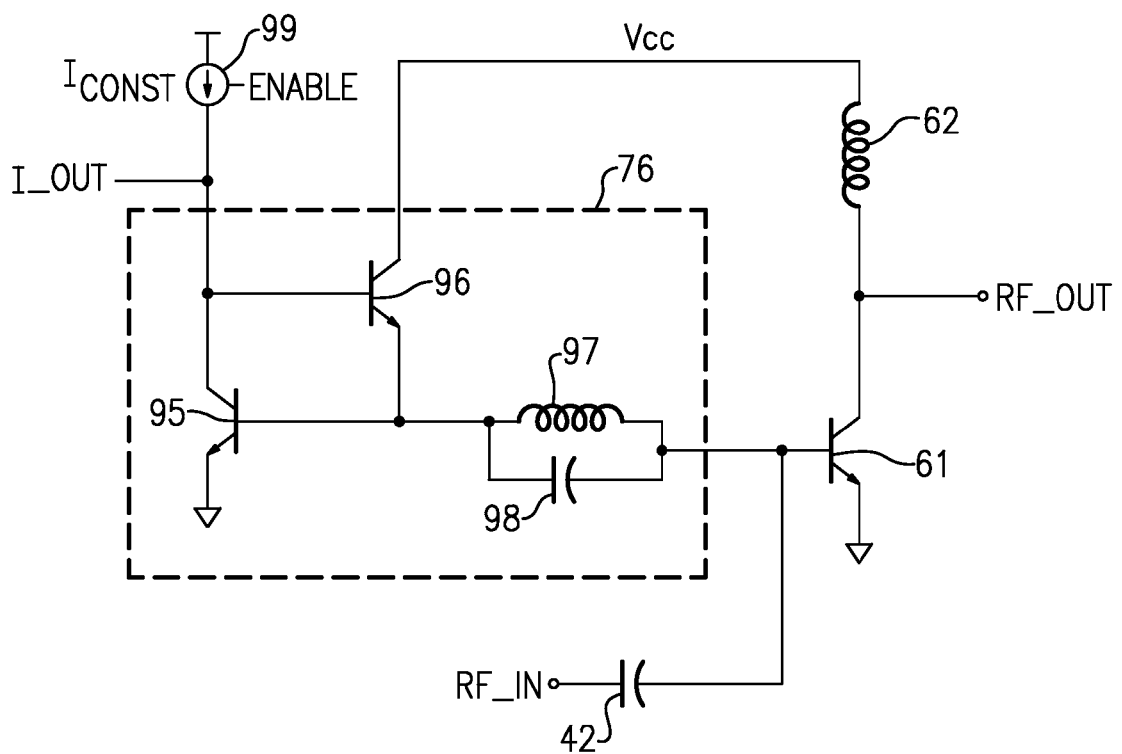
FIG. 8A is a circuit diagram that includes an example primary biasing circuit of FIG. 7 and the power amplifier transistor of FIG. 7 according to an embodiment.

Referring now to FIG. 8A, a circuit diagram that includes an example primary biasing circuit 76 of FIG. 7 and the power amplifier transistor 61 of FIG. 7 according to an embodiment will be described. As illustrated in FIG. 8A, the primary biasing circuit 76 can include a reference bipolar transistor 95, a base current helper transistor 96, and an RF trap circuit, which can include a capacitor 97 in parallel with an inductor 97.

As illustrated, the compensation signal $I_{OUT}$ from the compensation circuit 77 and a substantially constant reference current $I_{CONST}$ can be provided to the collector of the reference bipolar transistor 95 and the base of the base current helper transistor 96. A current source 99 can provide the reference current $I_{CONST}$ when the enable signal ENABLE indicates to activate the power amplifier transistor 61. The reference current $I_{CONST}$ can be generated, for example, using a bandgap circuit.

An emitter of the base current helper bipolar transistor 96 can be electrically coupled to the base of the reference bipolar transistor 95. The base of the reference bipolar transistor 95 can be electrically coupled to the base of the power amplifier transistor 61 by way of the RF trap circuit. The RF trap circuit can be arranged to trap an RF frequency to thereby filter out noise at that RF frequency. In other embodiments (not illustrated), the base of the reference bipolar transistor 95 can also be electrically coupled to the base of one or more other bipolar transistors. A bias signal can be provided to the base of the bipolar reference transistor 95 and to the bipolar power amplifier transistor 61 by way of the RF trap circuit.

In FIG. 8A, the reference bipolar transistor 95, the base current helper transistor 96, and the power amplifier transistor 61 are illustrated as NPN bipolar transistors. It will be understood that the principles and advantages discussed with reference to FIG. 8A and other figures can also be applied to PNP power amplifier transistors and reference transistors.

The reference bipolar transistor 95 and the power amplifier transistor 61 can form a current mirror. However, these transistors may not be operated under ideal conditions for optimal matching between transistors. The output current from the compensation circuit 77 can have a relatively high current value. The collector voltages of the reference bipolar transistor 95 and the power amplifier transistor 61 may not be equal. Accordingly, these transistors can warm up to different temperatures during a transmission burst. This warming up can be more pronounced for higher battery voltage supplies.

The physical spacing between the reference bipolar transistor 95 and the power amplifier transistor 61 may not be as close as would be ideal to give optimized matching. Accordingly, a common thermal environment may not be shared by the reference bipolar transistor 95 and the power amplifier transistor 61. This can contribute to mismatches between the reference bipolar transistor 95 and the power amplifier transistor 61.

The current mirror that includes the reference bipolar transistor 95 and the power amplifier transistor 61 can operate as intended when the voltage on these two transistors in substantially the same. However, due to non-ideal conditions, such as differences in thermal environment, a current mirror ratio of this current mirror can deviate from an ideal current mirror ratio. A higher effective current mirror ratio can result in a higher RF gain at a higher battery voltage as transmission bursts progress over time.

Figure 8B:
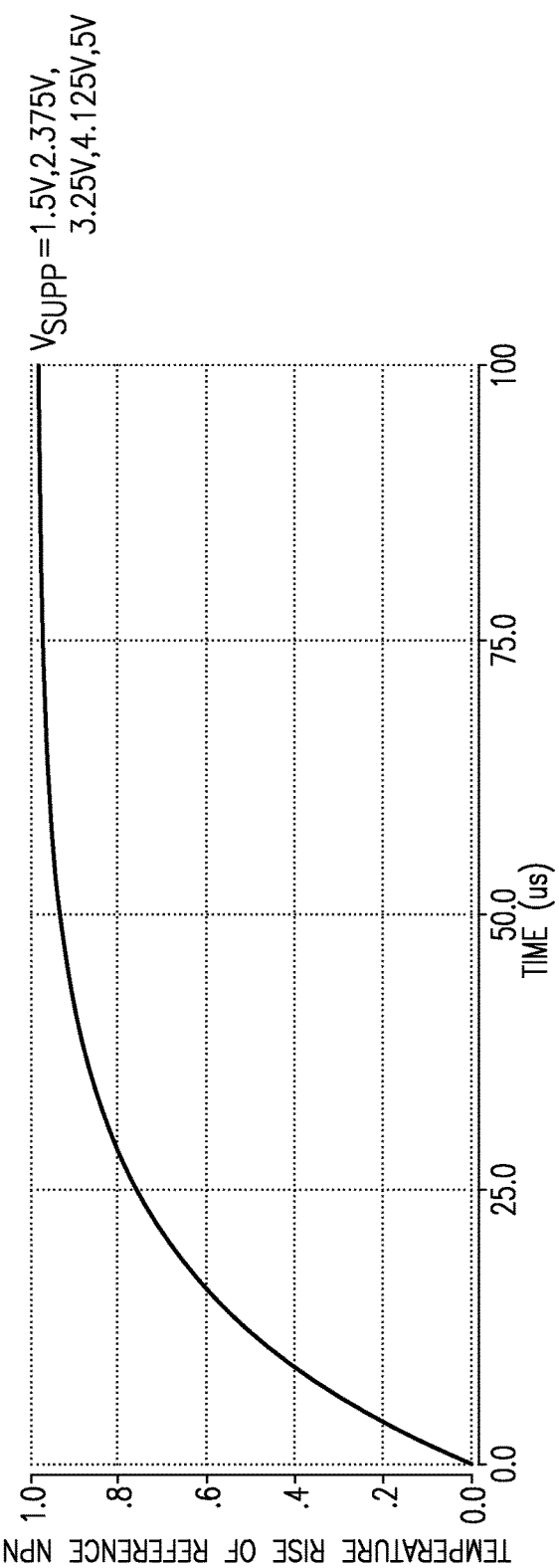
FIG. 8B is a graph that illustrates a relationship of temperature rise of the reference bipolar transistor of FIG. 8A over time.
Figure 8C:
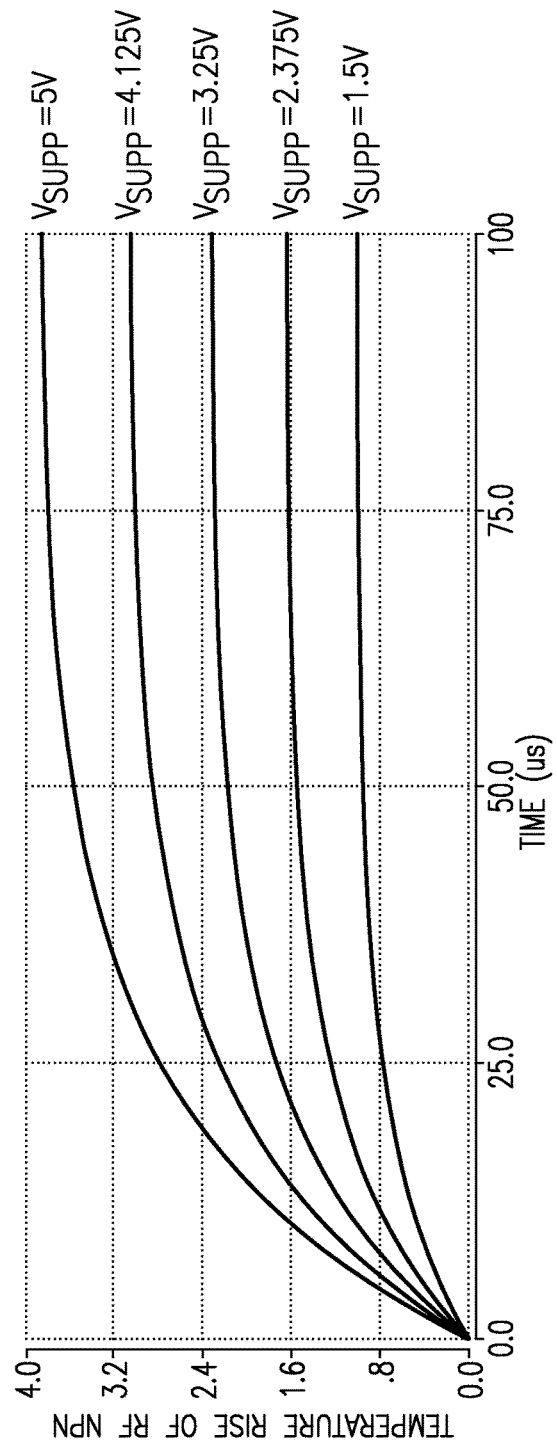
FIG. 8C is a graph that illustrates the temperature rise of the power amplifier bipolar transistor of FIG. 8A over time for various supply voltages.
Figure 8D:
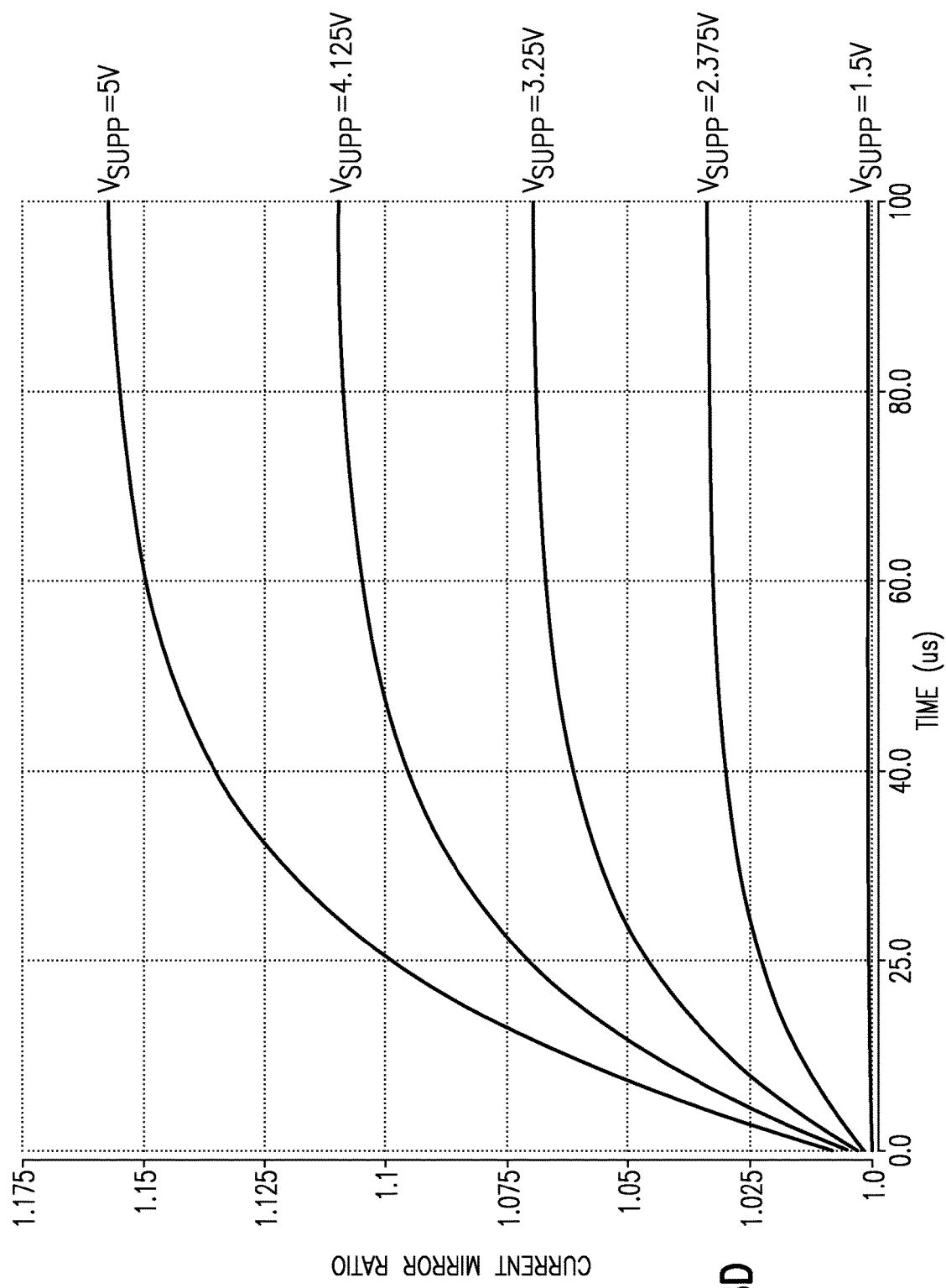
FIG. 8D is a graph that illustrates the effective current mirror ratio for the circuit of FIG. 8A during a transmission burst for various supply voltages.

FIGS. 8B to 8D illustrate effects of a thermal environment and supply voltage on the circuit illustrated in FIG. 8A. These graphs illustrate example results, which can vary due to variations due to process, layout, packaging, the like, or any combination thereof. While these graphs were generated in connection with equally sized reference bipolar transistor and power amplifier transistor, it will be understood that in practice the power amplifier transistor can be larger than the reference bipolar transistor. For instance, in certain embodiments, the power amplifier bipolar transistor can be about 10 times to about 30 times larger than the reference bipolar transistor.

FIG. 8B is a graph that illustrates a relationship of temperature rise of the reference bipolar transistor 95 of FIG. 8A over time. The curves shown in FIG. 8B correspond to various supply voltages and a stable 2 mA current provided to the collector of the reference bipolar transistor 95 of FIG. 8A. The curves of FIG. 8B illustrate a temperature rise of the reference bipolar transistor 95 at the start of a transmission burst. These curves illustrate that the temperature rise of the reference bipolar transistor 95 can be substantially independent of the supply voltage.

FIG. 8C is a graph that illustrates the temperature rise of the power amplifier transistor 61 of FIG. 8A over time for various supply voltages. The curves shown in FIG. 8C correspond to various supply voltages and a stable 2 mA current provided to the collector of the reference bipolar transistor 95 of FIG. 8A. The curves in FIG. 8C show that for higher supply voltages the temperature rise of the power amplifier transistor 61 is greater. This illustrates that the temperature rise of the power amplifier transistor 61 can be dependent on supply voltage.

FIG. 8D is a graph that illustrates the effective current mirror ratio for the reference bipolar transistor 95 and the power amplifier transistor 61 of FIG. 8A during a transmission burst for various supply voltages. The ratios in these plots correspond to the operating conditions of FIGS. 8B and 8C. The curves in FIG. 8D illustrate that as the supply voltage increases, the effective current mirror ratio can increase during a transmission burst. Accordingly, absent compensation, the gain of the power amplifier transistor 61 can increase during a transmission burst. The DEVM compensation described herein can mitigate the effects of temperatures and/or supply voltage on gain of a power amplifier transistor such that the power amplifier transistor has a substantially constant gain. For instance, the compensation circuit 77 of FIG. 7 can compensate for the effects shown in FIGS. 8B to 8D. In some embodiments, an input boost current provided to the compensation circuit 77 can be made proportional to $V_{BAT}-2V_{BE}$, where $V_{BAT}$ is a battery voltage and $2V_{BE}$ is a voltage on the collector of the reference bipolar transistor 95 of FIG. 8A.

Figure 8E:
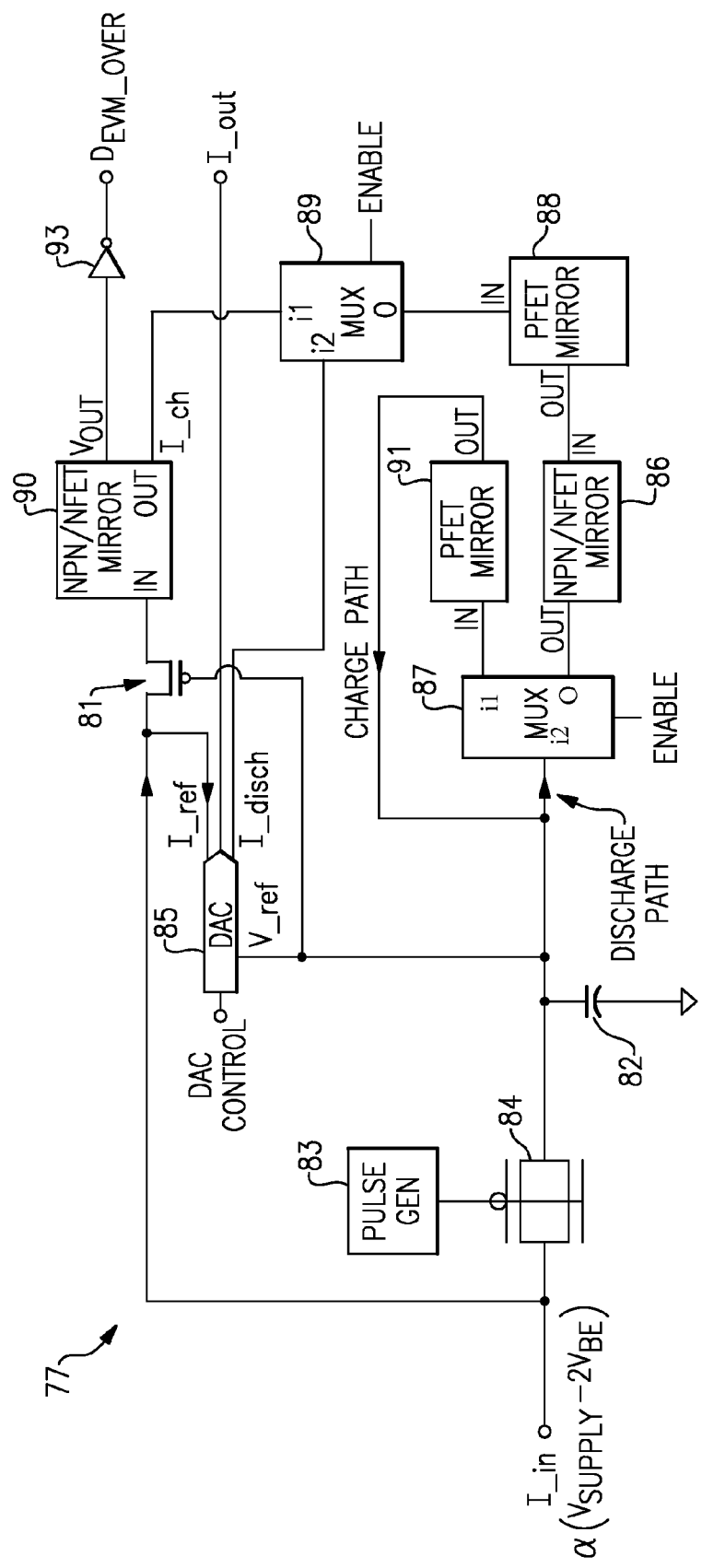
FIG. 8E is a circuit diagram of an example compensation circuit of FIG. 7 according to an embodiment.

With reference to FIG. 8E, an example of the compensation circuit 77 of FIG. 7 will be described. As illustrated, the compensation circuit 77 includes a capacitor 82, a pulse generator 83, a pass gate 84, a DAC 85, current mirrors 86, 88, 90, 91, multiplexers 87, 89, an inventor 93, and a pass transistor 81. As shown in FIG. 8E, the current mirrors 86 and 90 can be n-type current mirrors that include NPN transistors and/or NFETs and the current mirrors 88 and 91 can be p-type current mirrors that include PFETs. As such, in this implementation, the current mirrors 86 and 90 can sink current and the current mirrors 88 and 91 can source current. The RC circuit 79 of FIG. 7 can include the capacitor 82 and resistances associated with the capacitor 82 that are controlled by the charge control circuit 78 such that the voltage across the capacitor 82 is managed for generating the DEVM compensation signal. The scaling circuit 80 of FIG. 7 can include the DAC 85. The charge control circuit 78 of FIG. 7 can include one or more the current mirrors and/or one or more of the multiplexers and/or the pass transistor illustrated in FIG. 8E. The illustrated current mirrors can adjust current levels, for example, to control a rate at which the capacitor 82 charges and/or discharges. The illustrated multiplexers can select whether to pass a charge current or a discharge current based on whether a power amplifier is enabled. In some embodiments, the compensation circuit 77 can include more elements than illustrated in FIG. 8E and/or a subcombination of the illustrated elements. The capacitor 82 can be referred to as a DEVM capacitor. The capacitor 82 and the resistances associated therewith can have a time constant that is selected such that charge on the capacitor 82 can be used to compensate for DEVM.

The compensation circuit 77 can fully charge the capacitor 82 to provide maximum compensation after a cold start. A bias enable signal can change state to activate the bias circuit. The capacitor 82 can be fully charged responsive to the bias enable signal enabling the bias circuit. A power amplifier enable signal can turn a power amplifier on and off.

The power amplifier enable signal can be a periodic signal. The capacitor 82 can be charged and/or discharged based on the power amplifier enable signal.

The pulse generator circuit 83 can generate a pulse to fully charge the capacitor 82. The pulse generator circuit 83 can cause the capacitor 82 to be fully charged responsive to the bias enable signal transitioning to a state in which the power amplifier bias circuit is activated. A pass gate 84 can provide an input current $I_{IN}$ to the capacitor 82 to charge the capacitor 82. The input current $I_{IN}$ can cause the capacitor 82 to charge relatively fast.

The capacitor 82 can be discharged while the power amplifier is turned on. After the pulse generator circuit 83 closes the pass gate 84, the capacitor 82 can be discharged. A scaled down version of a mirrored current generated from the discharge current $I_{DISCH}$, which can be generated by the DAC 85. This scaled down current can be provided to the capacitor 82 to discharge the capacitor 82. As illustrated, the current mirror 86 can provide the scaled down mirrored discharge current to the capacitor 82. The scaled down mirrored discharge current can be provided to the capacitor 82 via a multiplexer 87 as illustrated. To realize relatively long transients of boost currents, a relatively small discharging current can be provided to the capacitor 82. This can account for some or all of the effects discussed with reference to FIGS. 5A and/or 5B according to certain embodiments. Such a current can be at least three or four orders of magnitude smaller than the input current $I_{IN}$ that charges the capacitor 82 through the pass gate 84. For instance, as one example, the peak charging current from the input current $I_{IN}$ can be about 200 uA and the scaled down discharge current can be about 14 nA.

The discharge current $I_{DICH}$ can be generated by the DAC 85. At the end of the timer pulse generated by the pulse generator 83, the capacitor 82 can reach a steady state in which it is fully charged. The voltage across the capacitor 82 can be provided to the DAC 85 as a reference voltage $V_{REF}$. The reference voltage $V_{REF}$ can turn on transistors, such as n-type field effect transistors (NFETs), in the DAC 85. This can cause the discharge current $I_{DISCH}$ to flow. The compensation signal $I_{OUT}$ can also be generated by the DAC 85 based on the reference voltage provided by the capacitor 82. A compensation signal $I_{OUT}$ can be generated based on the voltage level of the reference voltage $V_{REF}$ and the DAC control word DAC Control. As illustrated the compensation signal is an output current provided by the compensation circuit 77. In certain implementations, the DAC control word DAC Control can be set once to provide a desired scaling of the reference voltage for a particular application. The compensation signal $I_{OUT}$ can be a current boost for DEVM compensation. The DAC 85 can generate the reference current $I_{REF}$ based on the reference voltage $V_{REF}$. The reference current $I_{REF}$ can be independent of the DAC control word DAC Control. Accordingly, the reference current $I_{REF}$ can be representative of the voltage across the capacitor 82. The reference current $I_{REF}$ can be generated by any suitable circuitry configured to provide a current representative of the voltage across the capacitor 82. Such circuitry may not be considered part of a DAC in some implementations.

The discharge current $I_{DISCH}$ can be mirrored using the current mirror 88. The mirror ratio of the current mirror 88 can be configurable. For example, one or more current mirror select signals can activate and/or deactivate transistors of the current mirror 88 to create a desired current mirror ratio. The rate of discharge of the capacitor 82 can be adjusted based on the one or more current mirror select signals. The mirrored current can then be scaled down with the current mirror 86. The scaled down current can then cause the capacitor 82 to discharge.

The current boost for DEVM compensation can be based on the compensation signal $I_{OUT}$ generated by the DAC 85. For instance, the compensation signal $I_{OUT}$ can be added to another current, such as a substantially constant current produced by a bandgap circuit. As shown in FIG. 8A, the compensation signal $I_{OUT}$ and the reference current $I_{CONST}$ can be added. In some implementations, the boosted current is mirror and provided to the second and/or one or more subsequent stages of a multi-stage power amplifier. The compensation signal $I_{OUT}$ can depend on the DAC control word, as discussed above. The DAC control word can be selected to generate the compensation signal $I_{OUT}$ within a desired range for a particular application.

As discussed above, the power amplifier enable signal can periodically enable and disable the power amplifier in certain implementations. For instance, the graphs 610 to 650 correspond to a periodically enabled power amplifier. The capacitor 82 can be discharged while the power amplifier is turned on and charged while the power amplifier is turned off. Charging the capacitor 82 can be based on an amount of time that the power amplifier is disabled between successive transmission bursts. The amount of charge stored on the capacitor 82 can also correspond to heating of the power amplifier at the end of a transmission burst prior to the power amplifier being turned off.

When the power amplifier is turned on by a periodic enable signal, the capacitor 82 can be discharged. The input current $I_{IN}$ can be split into $I_{REF}$ and current provided to the input of the current mirror 90. During discharge, $I_{REF}$ can decrease and the current provided to the input of the current mirror 90 can increase. Then when the capacitor 82 is being charged, $I_{REF}$ can increase and the current provided to the input of the current mirror 90 can decrease.

A charge current $I_{CH}$ can be generated from the input current provided to the current mirror 90. The pass transistor 81, which can be a PFET transistor as illustrated, can provide an input to the current mirror 90. When the input current $I_{IN}$ is charging the capacitor 82, it can be desirable to prevent excess current from flowing into the current mirror 90 so that $I_{REF}$ can increase to match the input current $I_{IN}$. When the input current $I_{IN}$ is connected through the pass gate 84 to the capacitor 82, the voltage at the $I_{REF}$ output can across capacitor 82 can be substantially the same such that the pass transistor 81 can be biased off. When the pass gate 82 is opened, then the voltage on the $I_{REF}$ output can rise and excess current can flow to the current mirror via the pass transistor 81.

The charge current $I_{CH}$ can be attenuated relative to the input current provided to the current mirror 90. For instance, the charge current $I_{CH}$ can about ⅛ of the input current provided to the current mirror 90 in some implementations. The charge current $I_{CH}$ can be passed through the multiplexer 89 to the current mirror 88. The current mirror 88 can scale down the charging current $I_{CH}$. This current can be mirrored by current mirror 86 and provided to the current mirror 91 by way of the multiplexer 87. The output of the current mirror 91 can provide a scaled charging current to charge the capacitor 82.

The multiplexers 87 and 89 can pass charge currents when the power amplifier is turned off and pass discharge currents when the power amplifier is turned on. Accordingly, the multiplexers 87 and 89 can use the power amplifier enable signal or a variant thereof as a select signal. In FIG. 8E, when the power amplifier enable signal ENABLE indicates that the power amplifier is enabled, the multiplexer 87 provides a current path between its port i2 and port O and the multiplexer 89 provides a current path between its port i2 and port O. When the power amplifier enable signal ENABLE indicates that the power amplifier is disenabled, the multiplexer 87 provides a current path between its port i1 and port O and the multiplexer 89 provides a current path between its port i1 and port O.

The input current $I_{IN}$ can be substantially constant. Accordingly, a sum of $I_{REF}$ and the input current to the current mirror 90 can be substantially constant. The charging current $I_{CH}$ and the discharge current $I_{DISCH}$ are different from each other during the periodic enabling of the power amplifier. The charging current $I_{CH}$ can depend on the values of $I_{REF}$ and the input to the current mirror 90 when the power amplifier enable signal transitions to turn the power amplifier off. The discharging current $I_{DISCH}$ can depend on the values of $I_{REF}$ and the input to the current mirror 90 when the power amplifier enable signal transitions to turn the power amplifier on. The relative sizes of $I_{REF}$ and the input current $I_{IN}$ can result in different currents being provided to the current mirror 86. For example, if discharging is such that the input to the current mirror 90 becomes larger than the input current $I_{IN}$, then the input to the current mirror 86 should be at a higher current than for the previous transmission burst.

Average temperature of a power amplifier can be higher for higher duty cycles. Accordingly, less DEVM compensation can be provided to equalize the gain of the power amplifier during such transmission boosts. Shorter transmission bursts, which can have a lower duty cycle, can have more DEVM compensation in a bias signal applied to the power amplifier than longer transmission bursts with relatively less time between the bursts.

When the period of time between successive transmission bursts is relatively long, the capacitor 82 can be fully charged. As the voltage across the capacitor 82 increases, an output voltage $V_{OUT}$ increases. When $V_{OUT}$ increases to a threshold voltage, the inverter 93 can transition its output signal to a logic 0 value. This can cause the bias enable signal to turn off the biasing circuits. The next time the power amplifier is enabled, the biasing and control circuit 30 will start from a cold start and fully charge the capacitor 82.

A relatively higher supply voltage, such as a battery voltage, can generate more heat than a relatively lower supply voltage. Accordingly, there can be a higher DEVM with a higher supply voltage. As such, more current boost in the power amplifier bias current can be provided for a higher power supply voltage. The power supply boost circuit (not illustrated) can adjust the input current $I_{IN}$ based on the voltage level of the supply voltage. For example, the power supply boost circuit can increase the input current $I_{IN}$ for a higher power supply voltage and reduce the input current $I_{IN}$ for a lower power supply voltage. The power supply boost circuit can maintain the input current $I_{IN}$ at a current level that is proportional to $V_{SUPPLY} - 2V_{BE}$, where $V_{SUPPLY}$ is a supply voltage such as a battery voltage and $2V_{BE}$ is a voltage on a collector of the reference bipolar transistor such as the reference bipolar transistor 95 of FIG. 8A.

Figure 8F:
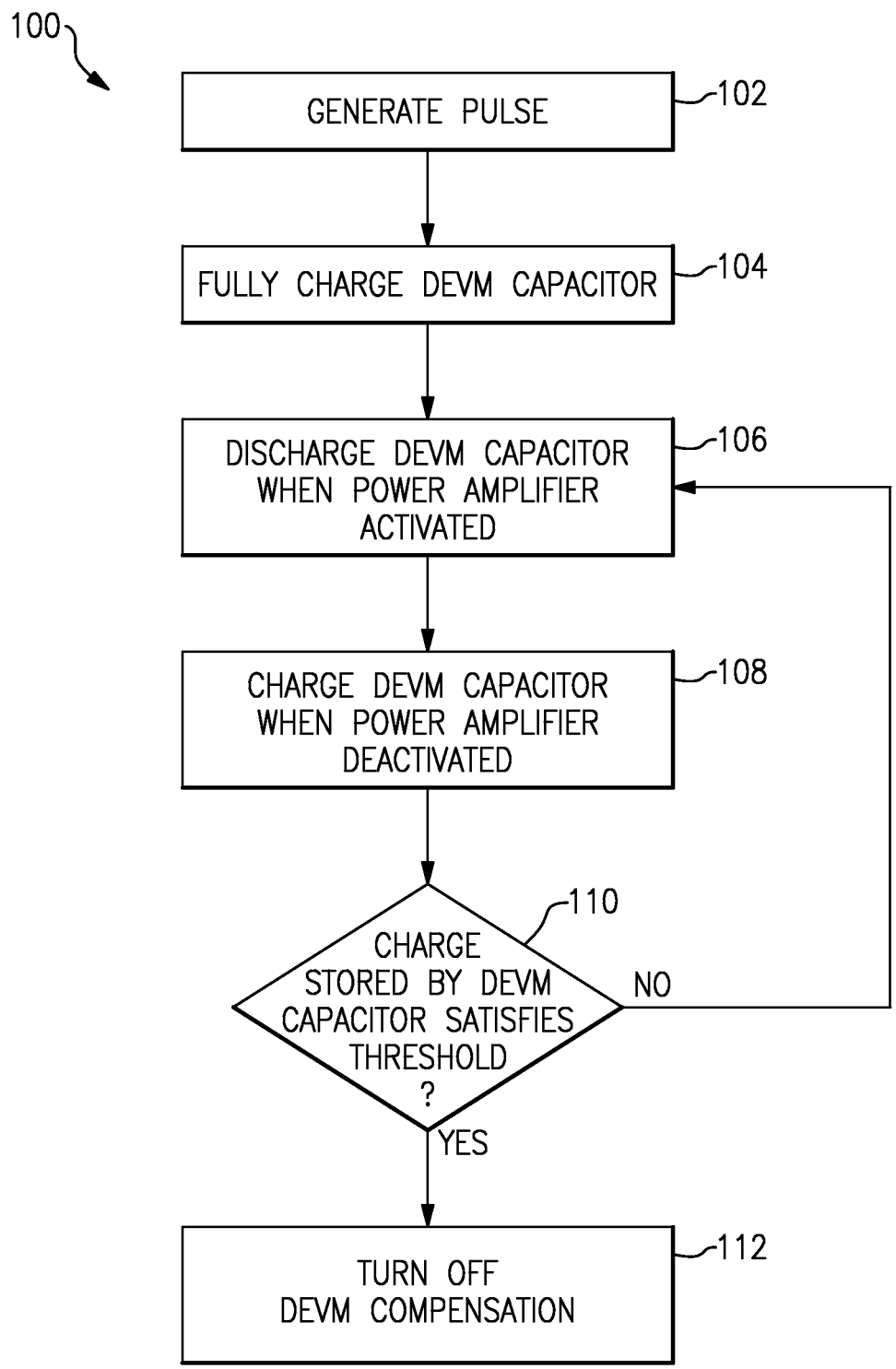
FIG. 8F is an illustrative flow diagram of a process of operating the compensation circuit of FIG. 8E according to an embodiment.

FIG. 8F is an illustrative flow diagram of a process 100 of operating the compensation circuit of FIG. 8E according to an embodiment. The process 100 will be described with reference to the compensation circuit 77 shown in FIG. 8E for illustrative purposes. Any combination of features discussed with reference to FIG. 8E can be implemented in connection with the process 100. It will be understood that the principles and advantages of the process 100 can be applied to other suitable compensation circuits. The operations of the process 100 can be performed in any suitable order. In some embodiment, a method can include additional operations than the process 100 and/or a subcombination of the illustrated operations.

A pulse can be generated at block 102. This pulse can be generated to charge the capacitor 82 when a power amplifier is activated after a cold start and/or after a power is deactivated for a relatively long period between transmission bursts. In certain implementations, the pulse can be asserted for on the order of 100 ns, such as about a few hundred nanoseconds. The pulse generator 83 can generate the pulse.

The capacitor 82 can be fully charged at block 104. The pulse generated at block 102 can cause one or more switches, such as the pass gate 84, to provide a current to the capacitor 82 to charge the capacitor. $I_{REF}$ can ramp up as the capacitor 82 charges until $I_{REF}$ approximately equals $I_{IN}$ and the voltage on capacitor 82 stabilizes. This can cause the capacitor 82 to fully charge such that the bias current for a power amplifier is boosted at a beginning of a transmission burst to a maximum amount after a cold start and/or after the power amplifier has been deactivated for a relatively long period of time.

When the power amplifier is activated, the capacitor 82 can be discharged at block 106. A discharge current can be provided to the capacitor 82 when the power amplifier is activated to control the discharge of the capacitor 82. The discharge current can be provided to the capacitor 82 from the DAC 85 by way of the multiplexer 89, the current mirror 88, the current mirror 86, the multiplexer 87, and the current mirror 91.

When the power amplifier is deactivated between transmission bursts, the capacitor 82 can be charged at block 108. The discharge current to the capacitor 82 can be disabled. The path through current mirrors 90 and 91 is enabled to provide a charge current to re-charge the capacitor. The multiplexer 89 can provide the current mirror 88 with the current from the current mirror 90 instead of the discharge current $I_{DISCH}$ from the DAC 85. The multiplexer 87 can provide the current mirror 91 with the current from the current mirror 86 instead of the current provided by the capacitor 82. Accordingly, the current mirror 91 can be enabled to re-charge the capacitor 82.

If a new transmission burst occurs while the capacitor 82 is being re-charged, the voltage on capacitor 82 can be used as a starting point for generating an amplitude of the compensation current $I_{OUT}$. This current should be less than the compensation current $I_{OUT}$ resulting from a cold start.

At block 110, a determination can be made as to whether the charge stored by the capacitor 82 satisfies a threshold. The threshold can represent that the capacitor 82 is fully charged. If the capacitor 82 charges sufficiently such that $I_{REF}$ is approximately equal to $I_{IN}$, then the current mirror 90 can drop out of conduction and the DEVM event can be deemed to be over. This can be sensed by a compensation deactivate signal $DEVM_{OVER}$. The $DEVM_{OVER}$ signal can turn off the compensation circuit 77, the primary biasing circuit 76 bias, other biasing circuitry, or any combination thereof so as to reduce power consumption.

When the threshold is not satisfied and the power amplifier is activated, the process can return to block 106 to discharge the capacitor 82. As such, when the power amplifier is activated and the $DEVM_{OVER}$ signal is not asserted, the capacitor 82 can be discharged at block 106.

On the other hand, when the threshold is satisfied, DEVM compensation can be turned off at block 112. After the DEVM compensation is turned off, any subsequent transmission burst can be treated as a cold start. When such a subsequent transmission burst occurs, the process can begin at block 102.

In certain embodiments, the power amplifier bias and control circuit 30 and the power amplifier 32 can be integrated on a single die with one or more other components to form a packaged power amplifier module. The die can be encapsulated in plastic. In one embodiment, the single die can be a SiGe die. In some other embodiments, the power amplifier bias and control circuit 30 and the power amplifier 32 can be embodied on separate die in a packaged power amplifier module. In one embodiment, the power amplifier 32 can be on a GaAs die and the power amplifier bias and control circuit 30 can be on a CMOS die. The packaged power amplifier modules can be, for example, mounted to a RF circuit board associated with the wireless device 11 of FIG. 2.

Figure 9A:
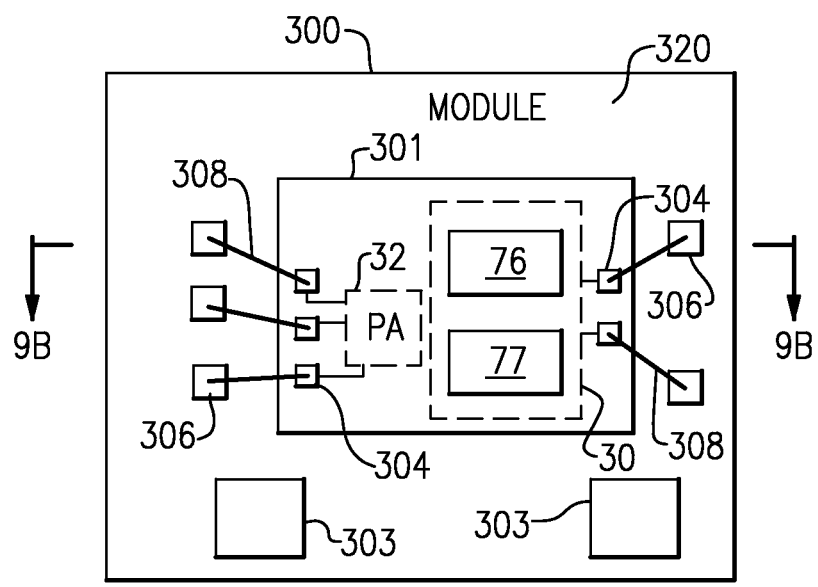
FIG. 9A is a schematic diagram of one example of a packaged power amplifier module.
Figure 9B:
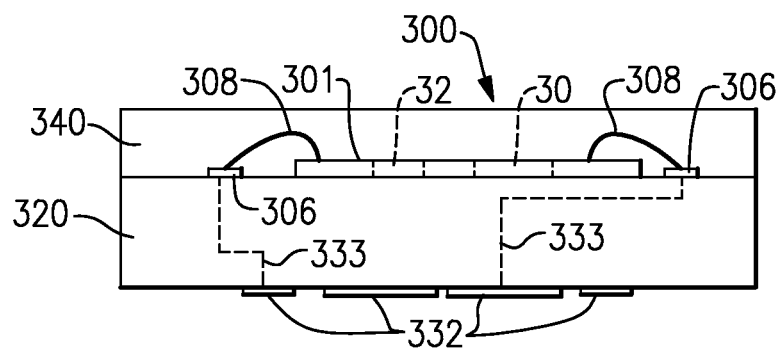
FIG. 9B is a schematic diagram of a cross-section of the packaged power amplifier module of FIG. 9 taken along the lines 9B-9B.

FIG. 9A is a schematic diagram of one example of a packaged power amplifier module 300. FIG. 9B is a schematic diagram of a cross-section of the packaged power amplifier module 300 of FIG. 9A taken along the lines 9B-9B.

The packaged power amplifier module 300 includes an IC or die 301, surface mount components 303, wirebonds 308, a package substrate 320, and encapsulation 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 9A and 9B, the die 301 includes the power amplifier 32 and the power amplifier bias and control circuit 30 formed therein. The power amplifier bias control and circuit 30 includes a primary biasing circuit 76 and a compensation circuit 77, which can be as described earlier.

The packaging substrate 320 can be configured to receive a plurality of components such as the die 301 and the surface mount components 303, which can include, for example, surface mount capacitors and/or inductors.

As shown in FIG. 9B, the packaged power amplifier module 300 is shown to include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 9B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged power amplifier module 300 can also include one or more packaging structures to, for example, provide protection and/or to facilitate handling of the packaged power amplifier module 300. Such a packaging structure can include overmold or encapsulation 340 formed over the packaging substrate 320 and the components and die(s) disposed thereon.

It will be understood that although the packaged power amplifier module 300 is described in the context of wirebond-based electrical connections, one or more features of the present disclosure can also be implemented in other packaging configurations, including, for example, flip-chip configurations. Moreover, it will be understood that one or more wirebonds can provide electrical connections between the power amplifier 32 and the power amplifier bias and control circuit 30. The separate dies can be formed using different process technology. For instance, a first die can be a GaAs die and a second die can be a CMOS die. As another example, the first die can be a SiGe die and the second die can be a CMOS die.

Some of the embodiments described above have provided examples in connection with power amplifiers and/or mobile devices. However, the principles and advantages of the embodiments can be used for any other systems or apparatus that could benefit from DEVM compensation.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An electronically-implemented method of biasing a power amplifier, the method comprising:
    selectively charging a capacitor to less than a full amount of charge between successive transmission bursts of the power amplifier based at least partly on an amount of time that the power amplifier is disabled between the successive transmission bursts, said selectively charging including providing a scaled charge current to the capacitor by way of a current mirror;
    scaling a reference signal generated from the capacitor with a digital-to-analog converter to provide a scaled reference signal;
    generating a bias signal based at least partly on the scaled reference signal; and
    biasing the power amplifier with the bias signal such that the power amplifier has a substantially constant gain.

2. The method of claim 1 further comprising fully charging, prior to said selectively charging, the capacitor to the full amount of charge prior to the power amplifier being turned on after a cold start.

3. The method of claim 1 further comprising disabling said selectively charging the capacitor in response to determining that the amount of charge stored by the capacitor satisfies a threshold.

4. The method of claim 1 wherein said selectively charging is further based at least partly on a voltage level of the power supply voltage.

5. The method of claim 1 wherein the method is performed by a mobile device.

6. A power amplifier system comprising:
    a power amplifier configured to receive a bias signal, receive a radio frequency signal, and provide an amplified radio frequency signal;
    a compensation circuit including (i) a capacitor configured to charge and discharge, (ii) a current mirror configured to provide a scaled down charge current to charge the capacitor, and (iii) a second current mirror configured to provide a scaled down discharge current to discharge the capacitor; the compensation circuit configured to charge the capacitor for an amount of time corresponding to the power amplifier being turned off between successive transmission bursts of the power amplifier, and the compensation circuit configured to generate a compensation signal based at least partly on an amount of charge stored on the capacitor; and
    a bias circuit configured to generate the bias signal based at least partly on the compensation signal.

7. The power amplifier system of claim 6 wherein the compensation circuit is configured to charge the capacitor based at least partly on an enable signal of the power amplifier.

8. The power amplifier system of claim 7 wherein the bias circuit is configured to receive the enable signal and to selectively pulse an output of the power amplifier based at least partly on the enable signal.

9. The power amplifier system of claim 6 wherein the bias circuit is configured to control the bias signal such that a gain of the power amplifier is substantially constant as the amount of time between successive transmission bursts of the power amplifier changes.

10. The power amplifier system of claim 6 wherein the power amplifier, the compensation circuit, and the bias circuit are included within a single package.

11. The power amplifier system of claim 6 wherein the power amplifier includes a bipolar power amplifier transistor having a base and a collector, the base configured to receive the bias signal, and the collector configured to provide the amplified radio frequency signal.

12. The power amplifier system of claim 6 wherein the compensation circuit includes a power supply boost circuit configured to adjust current to charge the capacitor based at least partly on a voltage level of a power supply voltage.

13. The power amplifier system of claim 6 wherein the amplified radio frequency signal is a wireless local area network signal.

14. A power amplifier system comprising:
    a power amplifier configured to receive a bias signal, receive a radio frequency signal, and provide an amplified radio frequency signal;
    a compensation circuit including a capacitor configured to charge and discharge and a current mirror configured to provide a scaled down charge current to charge the capacitor, the compensation circuit configured to charge the capacitor for an amount of time corresponding to the power amplifier being turned off between successive transmission bursts of the power amplifier, and the compensation circuit further including a scaling circuit configured to generate a compensation signal based at least partly on scaling a signal from the capacitor; and
    a bias circuit configured to generate the bias signal based at least partly on a combination of the compensation signal and a reference signal.

15. The power amplifier system of claim 14 wherein the compensation circuit further includes a second current mirror configured to provide a scaled down discharge current to discharge the capacitor.

16. The power amplifier system of claim 14 wherein the compensation circuit is configured to charge the capacitor based at least partly on an enable signal of the power amplifier.

17. The power amplifier system of claim 14 wherein the bias circuit is configured to control the bias signal such that a gain of the power amplifier is substantially constant as the amount of time between successive transmission bursts of the power amplifier changes.

18. The power amplifier system of claim 14 wherein the power amplifier, the compensation circuit, and the bias circuit are included within a single package.

19. The power amplifier system of claim 14 wherein the power amplifier includes a bipolar power amplifier transistor having a base and a collector, the base configured to receive the bias signal, and the collector configured to provide the amplified radio frequency signal.

20. The power amplifier system of claim 14 wherein the reference signal is a reference current provided by a current source configured to provide the reference current at a substantially constant level while the power amplifier is enabled.

21. The power amplifier system of claim 14 wherein the amplified radio frequency signal is a wireless local area network signal.

* * * * *